United States Patent [19]
Johnson

[11] 4,043,451
[45] Aug. 23, 1977

[54] SHIPPING CONTAINER FOR SILICONE SEMICONDUCTOR WAFERS

[75] Inventor: Douglas M. Johnson, Waconia, Minn.

[73] Assignee: Fluoroware, Inc., Chaska, Minn.

[21] Appl. No.: 668,204

[22] Filed: Mar. 18, 1976

[51] Int. Cl.² .................... B65D 73/02; B65D 85/42; B65D 81/02

[52] U.S. Cl. ................... 206/334; 229/14 C; 206/564; 206/587; 206/591; 211/41; 206/454

[58] Field of Search ............ 206/73, 328, 334, 309, 206/454-456, 521; 211/40, 41; 229/14 C

[56] References Cited

U.S. PATENT DOCUMENTS

| | | | |
|---|---|---|---|
| 2,808,189 | 10/1957 | Williams | 229/14 C |
| 2,863,595 | 12/1958 | Emery | 229/14 C |
| 3,294,244 | 12/1966 | Laughlin | 211/41 |
| 3,467,242 | 9/1969 | De Rousse | 206/334 |
| 3,792,771 | 2/1974 | Bonjean | 206/455 |
| 3,853,221 | 12/1974 | Boyd | 229/14 C |
| 3,923,156 | 12/1975 | Wallestad | 206/73 |

OTHER PUBLICATIONS

IBM Tech. Disclosure, Bouvier et al., vol. 14, No. 1 6/71.

*Primary Examiner*—William Price
*Assistant Examiner*—Douglas B. Farrow
*Attorney, Agent, or Firm*—H. Dale Palmatier

[57] ABSTRACT

A shipping container for silicone semiconductor wafers including an elongate receptacle with lid with interior wafer-locating ribs and resilient arcuately curved wafer supports positioned beneath and over the edges of the wafers and resiliently clamping such wafers in fixed position.

18 Claims, 11 Drawing Figures

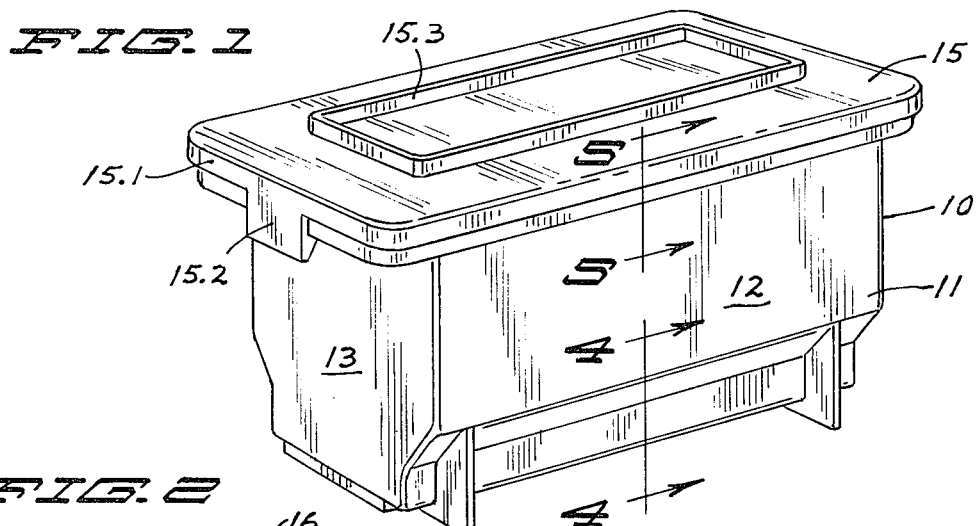
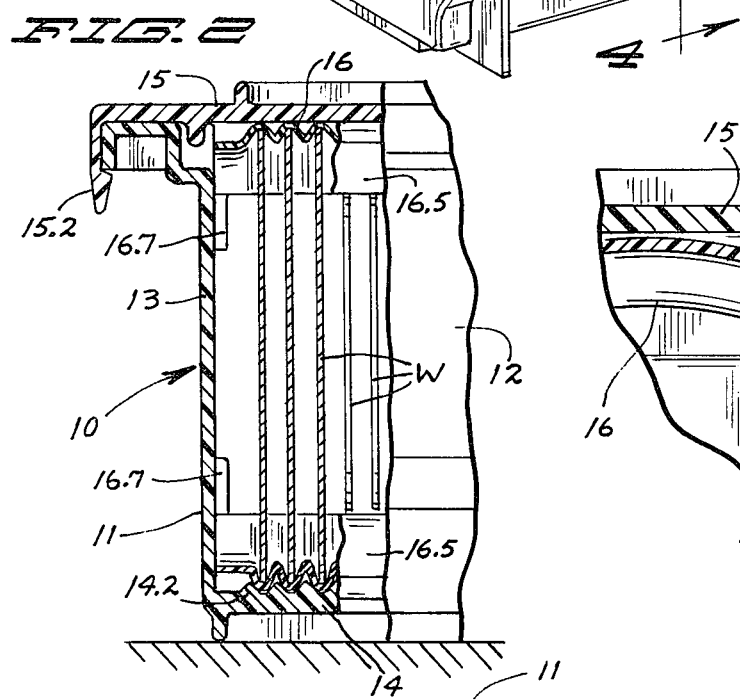
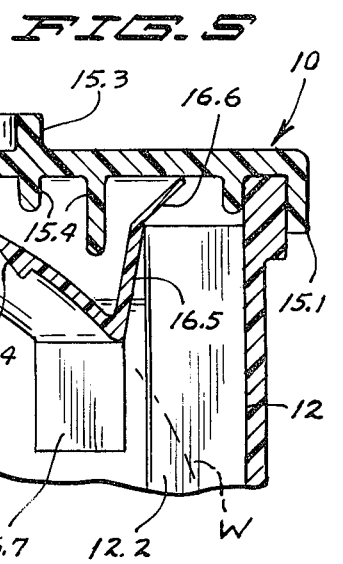
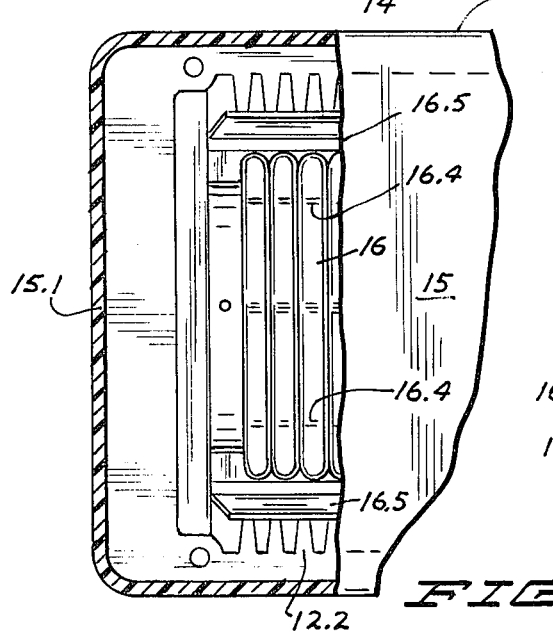
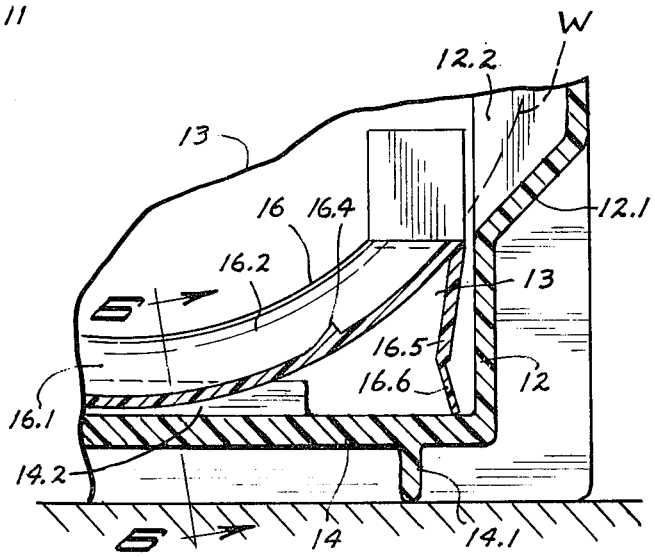

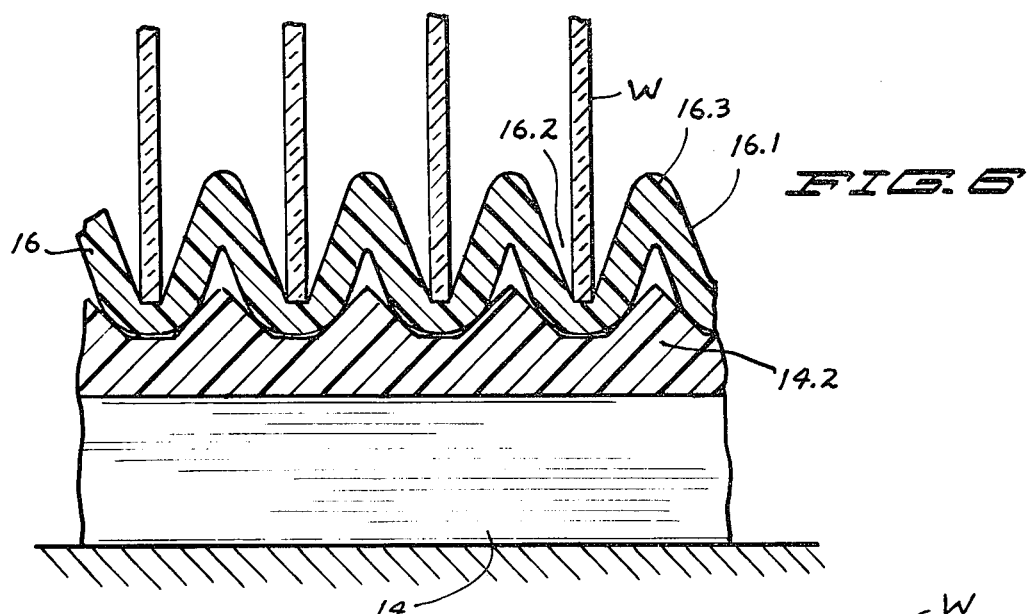
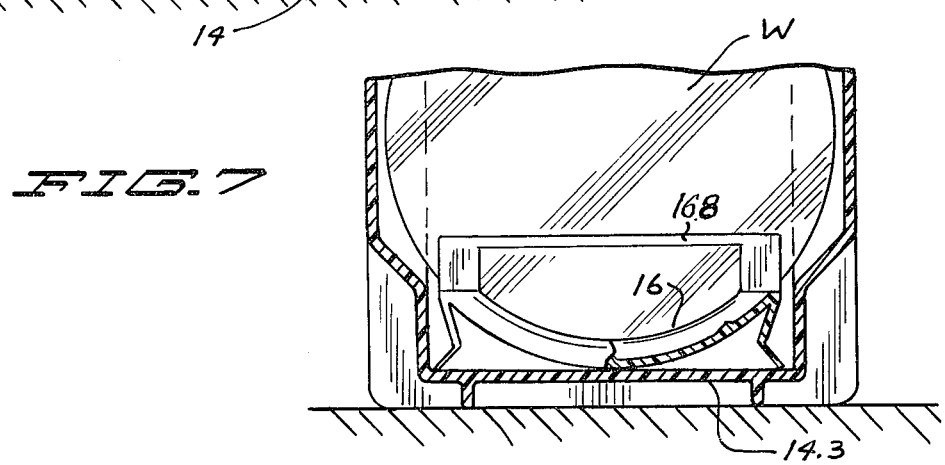
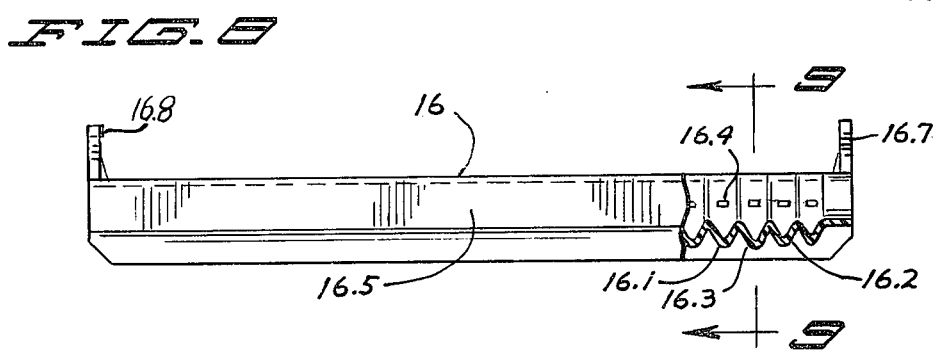
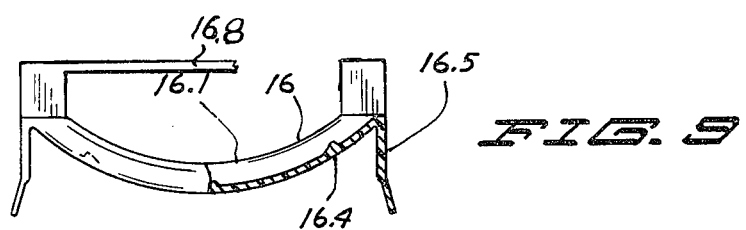

SHIPPING CONTAINER FOR SILICONE SEMICONDUCTOR WAFERS

BACKGROUND OF THE INVENTION

Semiconductor wafers made primarily of silicone are rather brittle and delicate in nature, but must be quickly handled during the processing thereof. Such wafers may be in the range of one and one-half to four inches in diameter and may be in the range of 15 to 50 thousandths of an inch in thickness. During the processing of such wafers, they are stored and handled in trays wherein the wafers essentially stand on edge in closely spaced relation to each other. Baskets or trays for handling such wafers accommodate 25 or more wafers at a time. Such trays or containers, typical of those commonly used, are illustrated in U.S. Pat. No. 3,701,558; U.S. application Ser. No. 378,686, filed July 12, 1973; and U.S. application Ser. No. 465,337, filed Apr. 29, 1974.

On certain occasions, it may be desirable to transport such silicone wafers during or after completion of the processing thereof. If such transporting is to be for a substantial distance, as by common carrier or the like, the shipping containers must protect the brittle, delicate wafers against damage. In handling such wafers, it is not uncommon to simply dump a tray of such wafers into a shipping container wherein the wafers are arranged in a manner similar to the arrangement in the processing trays.

BRIEF SUMMARY OF THE INVENTION

The present invention is a shipping container for storing such silicone wafers during transportation thereof. The container engages and restrains movement of the edges of the wafers so as to prevent damage to the wafers while keeping the wafers clean for further processing.

The container accurately locates the wafers which are dropped into it and the edges of the wafers are then carried on spring-like supports so as to keep the edges out of engagement with the rigid locator ribs in the container wall. Additional spring supports press the wafer down and clamp the wafers under continuing spring pressure to prevent the wafers from moving. Each spring support engages each wafer over a significant length of the peripheral edge of the wafer to increase the gripping of the wafers by the support and to reduce the likelihood of breakage of the wafers.

The spring supports confine the wafers at locations approximately midway between each of the rigid ribs on the container wall.

The spring-like supports or inserts cradle the edges of the circular wafers and apply pressure upon such wafers in their strongest dimension, that is, in the plane of the wafer. Such supports are arcuately configured to follow the contour of the wafers and are supported at numerous locations of the arcuate configuration so as to maximize the area of engagement between the edges of the wafers and the arcuate supports. Such arcuate supports extend the full length of the containers and, at their sides, have resilient legs or webs bearing against the container and continuously urging the supports firmly against the wafers. The supports additionally bear against the container intermediate the legs.

The spring-like supports are formed of a soft, resiliently flexible material which is both yieldable and flexible, and is resistant to flaking or creating dust or loose particles when cut or abraded. Preferably the supports are injection molded of low density polyethylene or similar plastics which are highly resistant to shaving or flaking when engaged or cut by the sharp-edged silicone wafers.

Such supports are grooved to maintain the wafers in properly spaced relation and to prevent movement of the wafers transversely of their planes. At the bottom of such grooves, the support has upstanding ribs extending across the groove to engage wafers which may be under-sized and may not extend fully down into the groove as otherwise normally expected. Such ribs are yieldable or collapsible to permit the edges of normal wafers to have maximum length of engagement with the support at the bottom of such grooves.

Both the container and its lid are constructed of polypropylene and accordingly are rigid, stiff and hard to afford ample protection for the wafers. The lid bears downwardly against the spring supports at the top of the container to minimize any likelihood of movement of the wafers in the container. The lid confronts the edges of the wafers along the longitudinal center line of the container, and in the intances wherein the wafers actually engage the container lid, the lid may actually flex and act like a spring to act upon the wafers in retaining them in predetermined position.

BRIEF DESCRIPTION OF DRAWINGS

FIG. 1 is a perspective view of the container;

FIG. 2 is a side elevation detail view of the container with portions thereof broken away and shown in section for clarity of detail;

FIG. 3 is a detail top plan view of the container with a portion of the lid broken away and illustrating the interior of the container for clarity of detail;

FIG. 4 is a transverse section taken at 4—4 in FIG. 1;

FIG. 5 is an enlarged detail section view taken approximately at 5—5 in FIG. 1;

FIG. 6 is a greatly enlarged detail section view taken approximately at 6—6 in FIG. 4 and shown with wafers assembled therewith;

FIG. 7 is a transverse section view illustrating a modified form of the invention;

FIG. 8 is a side elevation view of the insert for the shipping container;

FIG. 9 is an end elevation view, partly in section, at 9—9 of FIG. 8;

DETAILED DESCRIPTION OF THE INVENTION

Figure 10:
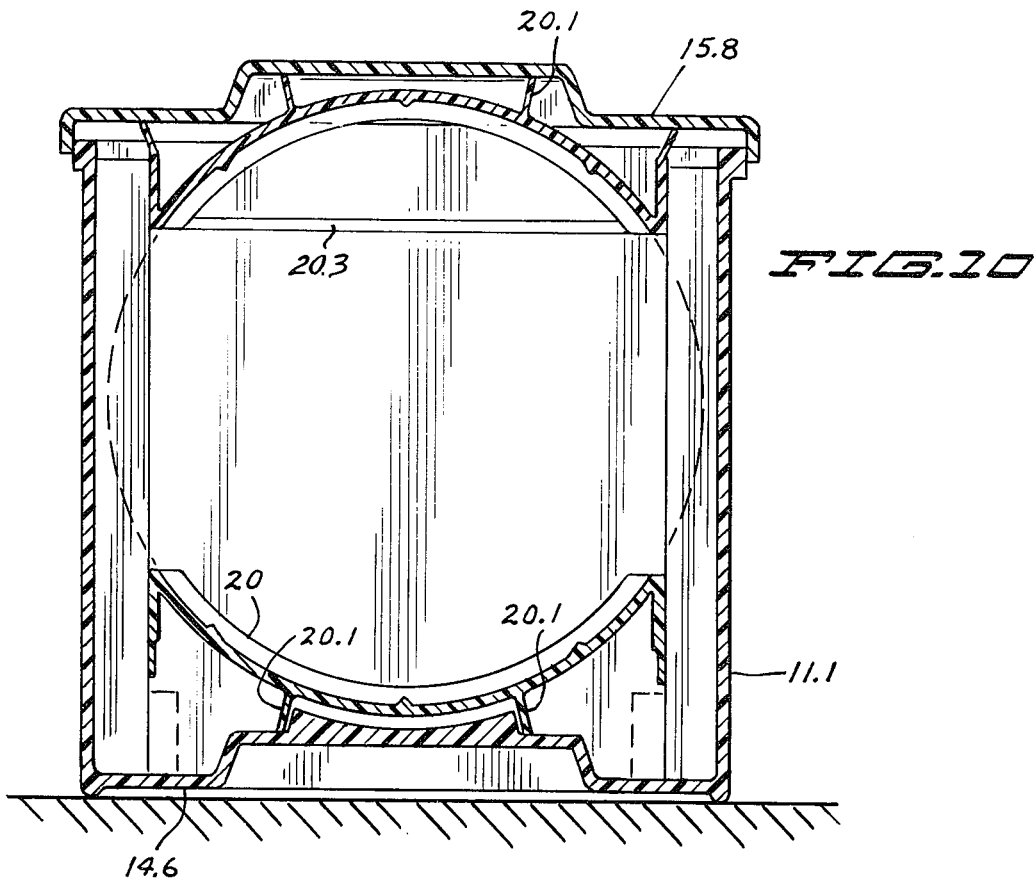
FIGS. 10 and 11 are transverse section views of another modified form of the invention and illustrating the receptacle in partly closed and completely closed conditions.

The shipping container for silicone semiconductor wafers is illustrated as a whole in FIG. 1 and is indicated in general by numeral 10. The container includes an open-topped receptacle 11 having side walls 12, end walls 13, and a bottom wall 14. The receptacle has a lid 15 which has a depending flange 15.1 extending downwardly around its entire periphery, and latching elements 15.2 at its opposite end so that the lid 15 will be securely held in place on the receptacle. The receptacle 11 including the lid 15 is preferably made of a stiff and relatively hard plastic as to be durable and rugged against damage during handling, and may be injection molded of polypropylene.

It will be noted that the receptacle has offsets 12.1 in the side walls 12 thereof for strength and stiffness, and an endless rectangular rib 14.1 is formed in the bottom wall to add stiffness and for provision of a stacking feature. At the interior of the side walls 12, the receptacle 11 is provided with a multiplicity of upright, but inwardly projecting rigid ribs or webs 12.2 to provide a rough locating facility for the wafers W which are carried in the interior chamber of the receptacle. Preferably the side wall ribs 12.2 have their upper edges or ends disposed slightly below the adjacent upper edges of side walls 12.

The lid 15 has an endless upstanding rectangular rib 15.3 at its exterior to cooperate with the rib 14.1 at the bottom wall of other containers 10 to facilitate ready and easy stacking of containers. The lid 15 also has several longitudinally extending ribs 15.4 located at the inner side for adding necessary stiffening to the lid to minimize bowing thereof when the lid is employed in holding down the wafers and when the lid is secured to the receptacle 11.

The bottom wall 14 is provided with a plurality of upwardly projecting ribs or cogs 14.2, each of which is disposed adjacent a pair of corresponding side wall ribs 12.2.

Each shipping container 10 is provided with a pair of wafer supports or inserts 16, one of which is disposed adjacent the lid 15 and the other of which is disposed adjacent the bottom wall 14. The inserts 16 are preferably injection molded of a soft, springy flexibly resilient material such as low density polyethylene. The inserts 16 serve the function of accurately locating the wafers W so that the wafers will be located midway between adjacent side wall ribs 12.2 and will be prevented from engaging such ribs, and the inserts 16 prevent both edgewise and transverse movement of all of the wafers carried in the receptacle.

Each of the inserts 16 comprises an elongate panel 16.1 which extends the full length of the interior chamber of the receptacle 11. The panel 16.1 has a width corresponding to the width between the lower portions of side walls 12 and between the inner edges of upright side wall ribs 12.2. As illustrated in FIGS. 4, 5 and 9, the panel 16.1 is arcuately curved between its sides with the approximate curvature of the peripheral edges of the wafers W so that a significant portion of the peripheries of the wafers will be engaged and retained thereby. In the form illustrated, the two inserts 16 at the top and bottom of the receptacle engage almost 50 percent of the periphery of the wafers therein so as to maintain a highly efficient control on the movement of the wafers in the receptacle.

It will be seen that the panel 16.1 is corrugated with the corrugations running in a side to side direction so as to form a multiplicity of adjacent grooves 16.2 and ridges 16.3. The ridges 16.3 are arranged as to be disposed adjacent a respective pair of side wall ribs 12.2 to assist in locating the wafers. The wafers will, as illustrated, bear against the inserts at the bottom of the grooves 16.2 as to be rigidly located between the adjacent side wall ribs 12.2 and thereby minimize any likelihood of breakage due to engagement between the ribs 12.2 and the brittle wafers W.

The inserts have a plurality of ribs 16.4, each extending across a respective groove 16.2, and being located adjacent the sides of the panel 16.1.

The ribs 16.4 are, in the form illustrated, mere dimples at the bottom of the grooves 16.2. These ribs 16.4 serve to initially engage the wafers which are pressed down into the grooves, and will normally yield and allow the wafer to be seated down entirely into the bottom of the groove to be engaged over a very substantial length of its periphery by the insert 16 at the bottom of the groove 16.2. However, in the event that certain of the wafers are slightly undersized, and cannot be entirely seated against the bottom of the groove, the ribs 16.4 will provide adequate engagement and will provide a significant holding force to retain the ribs in stationary condition in the container.

The wafer support 16 has support legs or webs 16.5, which may also be described as leaves, and which extend the full length of the supports 16. The webs 16.5 are molded integrally and in one piece with the wafer support 16 and provide resilient support for the side portions of the wafer support 16 by engaging adjacent portions of the receptacle 11. The webs 16.5 have outer edge portions 16.6 of reduced thickness as to be more flexible or have greater yieldability, thereby allowing the legs or webs 16.5 to resiliently collapse by flexing to engage the adjacent portions of the receptacle and maintain pressure inwardly against the wafers W confined in the receptacle. It will be seen that the lower wafer support 16 has the lower edges of its legs or support webs 16.5 in engagement with the bottom 14 of the receptacle; and the upper support has its support webs or legs in engagement with the lid 15.

After the wafers have been placed in the receptacle with the wafer supports 16 in place, the final closing of the lid 15 so that its latch or keeper 15.2 snaps over the rim of the receptacle, the downward pressure by the lid causes the wafers to be firmly seated in the grooves or corrugations of the wafer support and causes the support webs or legs 16.5 to slightly flex so that the edges of the wafers W are very tightly gripped and confined against movement in either edgewise or transverse direction. Both the lid 15 and the bottom wall 14 also engage the wafer support intermediate the legs 16.5 as well.

The bottom wall has a plurality of upstanding ribs or cogs 14.2, as best seen in FIGS. 4 and 6, and which are arranged to be in substantially the same planes which contain the side wall ribs 12.2. As will be seen in FIG. 6, the corrugations of the wafer support 16 have the same spacing as the ribs or cogs 14.2 so that the lower portions of the corrugations essentially bridge across between adjacent ribs 14.2 so that the wafers W will be very accurately located in the box. This accurate locating for transport is very important because the brittle wafers W must be kept away from and out of engagement with the hard ribs 12.2.

It should also be noted that when the lid 15 is closed down onto the receptacle and urges the wafers into seated relation in the wafer supports 16, the edges of the wafers will produce substantial collapsing of the ribs 16.4 which bridge across the grooves 16.2 in the wafer supports, thereby allowing maximum length of engagement between the peripheries of the wafers and the arcuately shaped groove bottoms in the wafer support. In the event there is some minor variation in the size of the wafers being carried, an undersized wafer will engage the several ribs 16.4, but may not entirely collapse such ribs simply because the wafers may not be large enough, but, in any event, the ribs 16.4 will produce a high degree of gripping and holding of the wafers in stationary position.

In the modified form of FIG. 7, the bottom wall 14.3 has a smooth and flat interior surface and is formed without the comparable ribs or cogs which are illustrated in FIGS. 2, 4 and 6. In this form of the invention, the intermediate portion of the wafer support 16 is seated directly upon the flat inner surface of the bottom wall 14.3, and the supports webs or legs 16.5 may be collapsed to some greater degree in supporting the sides of the wafer support and exerting inwardly directed pressure thereon.

The upstanding end tabs 16.7 are particularly useful for guiding the wafer support 16 downwardly over the top of the wafers W prior to the closing of lid 15. The tabs 16.7 are guided along the end wall 13 of the receptacle and assure proper positioning of the corrugations in the wafer support relative to the wafers that are already in the container and relative to the side wall ribs 12.2. At one end of each of the inserts 16, the tabs 16.7 are interconnected by a bar 16.8 which provides a brace and a handle facilitating ready and easy removal of the insert from the container.

Figure 11:
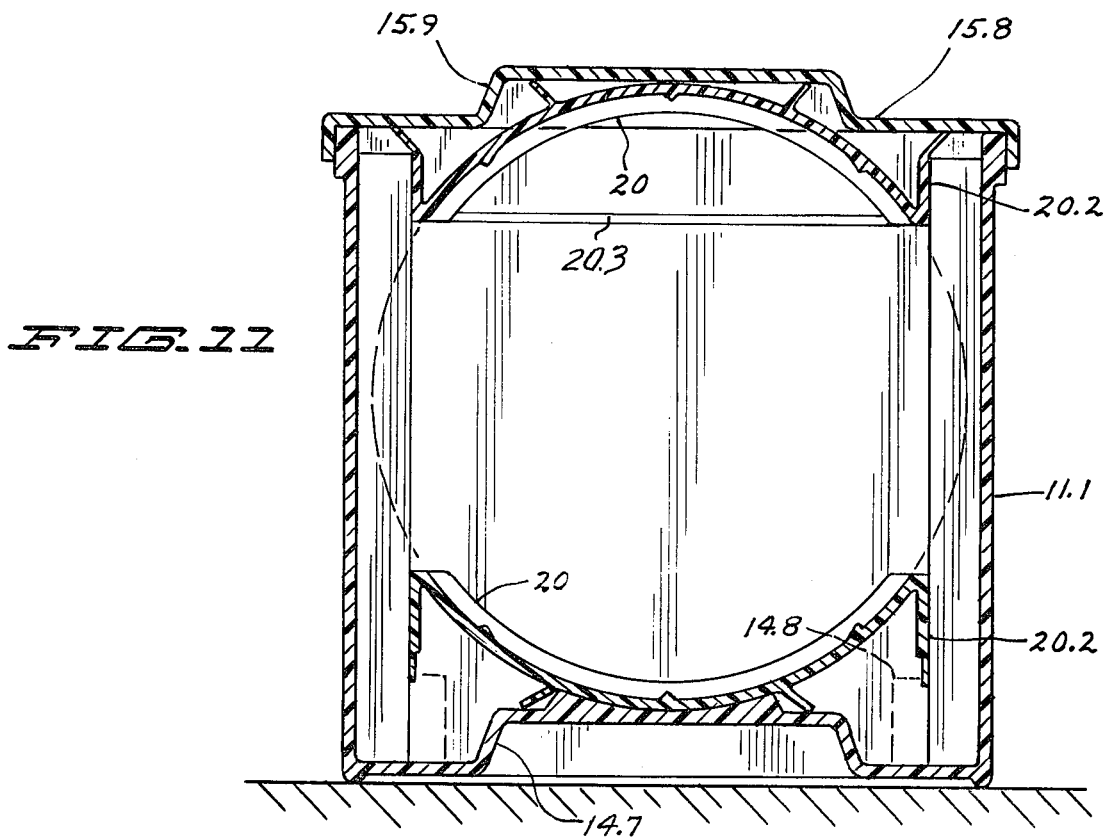

In the form of the invention illustrated in FIGS. 10 and 11, the wafer supports 20 are constructed substantially the same as wafer supports 16 illustrated in the other views. The wafer supports 20 have, however, outwardly projecting support webs or legs 20.1 located intermediate the opposite sides of the wafer support for engaging intermediate areas of the container bottom 14.6 and intermediate portions of the lid 15.8. The intermediate support webs or legs 20.1 are partially collapsed by flexing when the lid 15.8 is pressed downwardly into its final position as illustrated in FIG. 11. It will be noted that the receptacle 11.1 has its bottom wall 14.6 provided with an offset portion 14.7 for strengthening and resisting any bowing or warping. Similarly, the lid 15.8 has also an offset portion 15.9 for producing the necessary strength against bowing. The support webs or legs 20.2 at the sides of the wafer supports 20 provide the necessary stiffening of the wafer support 20 along its longitudinal length, as do the webs 16.5 in the first form of the invention. It has been found that in certain receptacles 11.1 it is desirable to provide ledges 14.8 adjacent the side wall ribs to engage the lower edges of the support webs 20.2 and cause flexing of these webs as to create additional inward pressure on the adjacent portions of the wafers. It will be recognized that the supporting webs 20.1 and 20.2 extend the full length of the wafer supports 20 and the full length of the receptacle. Again, at one end of each insert 20, a bar 20.3 extends across from one side to the other.

It will be seen that I have provided a new and improved shipping container for silicone semiconductor wafers and the like wherein a rigid protective container is provided with relatively soft and resiliently yieldable wafer supports which extend arcuately about the peripheries of such wafers and wherein the wafers are confined against edgewise movement or transverse movement so as to be protected against any likelihood of breakage in the container.

What is claimed is:

1. An insert for an elongate shipping container for silicone semiconductor wafers and the like, comprising:
    an elongate panel of soft and springy plastic to extend longitudinally of and within the container, the panel having a front wafer-engaging face with a multiplicity of corrugations extending transversely of the elongate panel from side to side thereof, the panel also having a rear face opposite the front face, and
    a plurality of elongate resiliently flexible spring leaves on the panel and standing on edge on the rear face thereof and projecting outwardly therefrom, the elongate leaves having longitudinal edges to bear against the inside of the receptacle as the leaves flex and cause the corrugated face of the springy panel to resiliently bear inwardly against the peripheral edges of the wafers to restrain the wafers against movement in the container during transport.

2. A shipping container for frangible wafers and the like, comprising:
    an elongate receptacle having side and bottom walls and a removable lid to provide access into the interior chamber wherein such wafers are received and stored, the receptacle having wafer-locating means maintaining the wafers in spaced and confronting relation to each other and oriented transversely of such side walls; and
    means in the receptacle and adjacent the lid to engage and restrain such wafers, and including an elongate wafer support adjacent the lid within the interior chamber and extending longitudinally thereof to overlie the wafers, said wafer support being formed of soft, springy plastic and having a lower wafer-engaging face with corrugations formed therein to receive and locate and retain the wafers in predetermined positions, each of said supports having a plurality of resiliently flexible spring leaves projecting outwardly away from the wafers and upwardly into engagement with the lid, and said leaves flexing against the lid and resiliently urging the wafer support inwardly of the interior chamber and against the peripheral edges of the wafers to restrain the wafers against movement in the receptacle during transport.

3. The shipping container according to claim 2 and the interior chamber of the receptacle defining corner areas at the junctures between the side walls and the lid, and
    the leaf of the support bearing against the receptacle in such corner areas to maintain inward resilient pressure on the wafer.

4. A shipping container for silicone semiconductor wafers and the like, comprising:
    an elongate receptacle having side and bottom walls and a removable lid to provide access into the interior chamber wherein such wafers are received and stored, the receptacle having wafer-locating means therein to maintain the wafers in spaced and confronting relation to each other; and
    a pair of elongate wafer supports of soft, springy plastic and disposed within the interior chamber and extending longitudinally thereof, said wafer supports being respectively disposed adjacent the lid and bottom wall of the receptacle and bearing against the lid and bottom wall, the wafer support having opposite sides and being arcuately curved from side to side, and each of such wafer supports extending from side to side around a significant portion of the interior periphery of the interior chamber to cradle and extend around significant portions of the peripheries of the wafers in the receptacle, each of said wafer supports engaging adjacent portions of the receptacle whereby to be resiliently urged by the receptacle inwardly against the wafer peripheries.

5. The shipping container according to claim 4 and the wafer support having a multiplicity of corrugations extending from side to side, such corrugations locating and retaining the wafers independently of the wafer-locating means of the receptacle.

6. The shipping container according to claim 5, and the corrugations defining adjacent grooves and ridges, and the wafer support defining a pair of spaced ribs extending across each such groove.

7. The shipping container according to claim 5 and including an elongate stiff web at each side of the support and extending between the receptacle and the support at an acute angle to minimize longitudinal bowing of the support along the length of the receptacle.

8. A shipping container for silicone semiconductor wafers and the like, comprising:
an elongate receptacle having side and bottom walls and a removable lid to provide access into the interior chamber wherein such wafers are received and stored, the receptacle having wafer-locating means therein to maintain the wafers in spaced and confronting relation to each other and oriented transversely of such side walls; and
a pair of elongate wafer supports of soft, springy plastic and disposed within the interior chamber and extending longitudinally thereof, said wafer supports being respectively disposed adjacent the lid and the bottom wall of the receptacle and bearing against the lid and bottom wall, the wafer supports having opposite sides and being arcuately curved from side to side, each of such wafer supports extending in a side to side direction around a significant portion of the interior periphery of the interior chamber to cradle and extend around significant portions of the peripheries of the wafers in the receptacle, each of the wafer supports having means stiffening and supporting such sides to maintain firm engagement between the wafer support and the edges of the adjacent wafers, such means including resilient legs projecting outwardly relative to the arcuate shape and bearing against the adjacent portions of the receptacle to continuously urge the support against the wafer peripheries.

9. The shipping container according to claim 8 and such resilient legs of the wafer support being disposed adjacent the marginal edges of such sides.

10. The shipping container according to claim 8 and said resilient legs being disposed intermediate said sides of the wafer support.

11. A shipping container for silicone semiconductor wafers and the like comprising:
an elongate receptacle having side and bottom walls and a removable lid to provide access into the interior chamber wherein such wafers are received and stored, the receptacle having wafer-locating means therein to maintain the wafers in spaced and confronting relation to each other and oriented transversely of such side walls;
a pair of elongate wafer supports of soft and springy plastic and being removably mounted within the interior chamber of the receptacle and extending longitudinally thereof, said wafer supports being respectively disposed adjacent the lid and bottom wall of the receptacle and bearing against said lid and bottom wall, the wafer supports having opposite sides and being arcuately curved from side to side, and the wafer supports having corrugations extending from side to side and around such arcuate curvature to cradle and space apart such wafers, such wafer supports extending transversely across both the lid and bottom wall substantially entirely between the side walls of the receptacle to cradle and extend around significant portions of the peripheries of the wafers in the receptacle, each of the wafer supports having elongate webs at the opposite sides thereof and extending substantially through the entire length of the support, said webs projecting outwardly from the support relative to the arcuate shape and into engagement with the adjacent receptacle, such webs being resiliently yieldable for collapsing and exerting continuous pressure to urge the wafer support against the wafer peripheries.

12. The shipping container according to claim 11 and said webs having outer marginal edge portions of reduced thickness to localize the resilient yielding and flexing of such webs.

13. An insert for a shipping container for confining silicone semiconductor wafers and the like, comprising:
an elongate panel of soft, springy plastic having opposite sides and also having an arcuate shape from side to side for substantially conforming to the peripheral shape of such wafers, the panel having corrugations extending from side to side to space such wafers apart, the panel also having means stiffening and supporting such sides and including resilient legs projecting outwardly from the panel relative to the arcuate shape.

14. The insert according to claim 13 and said legs comprising elongate webs extending longitudinally along the panel.

15. The insert according to claim 13 and said legs being integral of and in one piece with the panel and being resiliently collapsible.

16. The insert according to claim 14 and the legs extending outwardly transversely relative to a tangent of the side to side arcuate shape.

17. The insert according to claim 13 and including locating tabs integrally of and in one piece with the panel and such tabs being disposed at the ends of the panel and extending transversely thereof.

18. A shipping container for silicone semiconductor wafers and the like, comprising:
an elongate receptacle having side and bottom walls and a removable lid to provide access into the interior chamber wherein such wafers are received and stored, the receptacle having wafer-locating means therein to maintain the wafers in spaced and confronting relation to each other and oriented transversely of such side walls; and
an elongate wafer support of soft, springy plastic nd disposed within the interior chamber and extending longitudinally thereof, said wafer support being disposed adjacent the lid of the receptacle and bearing against the lid, the wafer support having opposite sides and being arcuately curved from side to side, the wafer support extending in a side to side direction around a significant portion of the interior periphery of the interior chamber to cradle and extend around significant portions of the peripheries of the wafers in the receptacle, the wafer support having means stiffening and supporting said sides to maintain firm engagement between the wafer support and the edges of the adjacent wafers, such means including resilient legs projecting outwardly relative to the arcuate shape and bearing against the adjacent portions of the receptacle to continuously urge the support against the wafer peripheries.

* * * * *